United States Patent
Kim et al.

(10) Patent No.: US 7,781,281 B2
(45) Date of Patent: Aug. 24, 2010

(54) METHOD OF FABRICATING SELF-ALIGNED CONTACT PAD USING CHEMICAL MECHANICAL POLISHING PROCESS

(75) Inventors: Ho-Young Kim, Seongnam-si (KR);
Chang-Ki Hong, Seongnam-si (KR);
Bo-Un Yoon, Seoul (KR); Joon-Sang Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/694,715

(22) Filed: Jan. 27, 2010

(65) Prior Publication Data

US 2010/0124817 A1 May 20, 2010

Related U.S. Application Data

(62) Division of application No. 11/525,490, filed on Sep. 23, 2006, now Pat. No. 7,670,942.

(30) Foreign Application Priority Data

Sep. 28, 2005 (KR) ............... 10-2005-0090761

(51) Int. Cl.
*H01L 21/8238* (2006.01)
(52) U.S. Cl. .............. 438/229; 438/299; 438/618; 438/633; 438/634; 257/E21.58
(58) Field of Classification Search .......... 438/229, 438/299, 618, 633, 634; 257/E21.58
See application file for complete search history.

(56) References Cited

U.S. PATENT DOCUMENTS

2006/0024884 A1* 2/2006 Kim et al. ............ 438/253

* cited by examiner

*Primary Examiner*—Thanhha Pham
*Assistant Examiner*—Tony Tran
(74) *Attorney, Agent, or Firm*—F. Chau & Associates, LLC

(57) ABSTRACT

A method of fabricating a self-aligned contact pad (SAC) includes forming stacks of a conductive line and a capping layer on a semiconductor substrate, spacers covering sidewalls of the stacks, and an insulation layer filling gaps between the stacks and exposing the top of the capping layer, etching the capping layer to form damascene grooves, forming a plurality of first etching masks with a material different from that of the capping layer to fill the damascene grooves without covering the top of the insulation layer, and forming a second etching mask having an opening region that exposes some of the first etching masks and a portion of the insulation layer located between the first etching masks. The method further includes etching the portion of the insulation layer exposed by the opening region using the first and second etching masks to form a plurality of opening holes, removing the second etching mask, forming a conductive layer filling the opening holes to cover the remaining first etching masks and performing a chemical mechanical polishing (CMP) process on the conductive layer using the capping layer as a polishing end point to remove the first etching masks such that a plurality of SAC pads separated from each other are formed that fill the opening holes.

9 Claims, 13 Drawing Sheets

METHOD OF FABRICATING SELF-ALIGNED CONTACT PAD USING CHEMICAL MECHANICAL POLISHING PROCESS

CROSS-REFERENCE TO RELATED PATENT APPLICATION

This application is a divisional of application Ser. No. 11/525,490, filed Sep. 23, 2006 now U.S. Pat. No. 7,670,942, which claims priority to Korean Patent Application No. 10-2005-0090761, filed on Sep. 28, 2005, the disclosures of which are each incorporated herein by reference in their entireties.

BACKGROUND OF THE INVENTION

1. Technical Field

The present disclosure relates to a method of fabricating a semiconductor device, and more particularly, to a method of fabricating a self-aligned contact (SAC) pad using a chemical mechanical polishing (CMP) process.

2. Description of the Related Art

As semiconductor devices have become highly integrated and design rules have become stricter, obtaining a sufficient process margin is regarded as a significant factor when forming contact pads to connect transistors to lines such as bit lines or transistors to capacitors. Accordingly, forming a self-aligned contact (SAC) pad self-aligned with a line such as a gate line becomes significant.

For example in forming a conventional SAC pad, a capping layer of a line and a spacer serve as an etch stop layer when forming an opening hole for a contact pad to pass through an insulation layer, such that the opening hole can be self-aligned with the line. Moreover, as a photoresist mask having an opening region larger than that of the opening hole can be used as an etching mask, a more sufficient process margin of a photolithography process can be obtained.

However, as the design rules of semiconductor devices have been significantly reduced, there is a demand for an improved method for obtaining a sufficient process margin for a photolithography process when forming a photoresist mask.

Moreover, when forming a conductive layer that fills the opening hole and forming each SAC pad, the resulting structure having the SAC pad has a more planarized surface by using a chemical mechanical polishing (CMP) process as a SAC pad node separation method. Furthermore, a subsequent process can be performed on the more planarized surface such that a sufficient process margin for the subsequent photolithography process can be obtained.

Also, during a conventional SAC pad process, the separating of the SAC pad using a CMP process is used to overcome the limitation of the design rules. Additionally, detecting an end point of a CMP process becomes significant for accurately controlling the CMP process.

However, a difficulty with conventional SAC pad process, may be that when selectively etching an opening hole during the SAC pad process, a capping layer for a line and/or a spacer for an etch stop layer can be unnecessarily removed. Therefore, the detection of the end point of the CMP process becomes more difficult.

For example, the thickness of a capping layer in a region that is covered by a photoresist mask used for an etching mask when etching the opening hole can be different from the thickness of a remaining capping layer in a region that is uncovered by a photoresist mask. The covered capping layer is undesirably etched during the CMP process. Consequently, as the thickness of the capping layer below the conductive layer for the SAC node varies according to a region, the height of the capping layer is varied when using the capping layer as an end point of the CMP process. Therefore, with the above conventional SAC pad process, the accurate detection of the end point becomes more difficult, and thus it may also be difficult to achieve reliable node separation.

Consequently, as a result of the above-mentioned difficulty of a conventional SAC pad process in detecting a CMP end point, after a CMP process, a local height difference can occur between the region where the SAC pad is formed and the region where the SAC pad is not formed. The height difference can be a factor that limits the process margin of the following photography process.

Moreover, when the CMP end point is not detected accurately, a relatively large number of methods of performing a CMP process may be required to obtain reliable node separation. These additional CMP processes can damage the capping layer and the spacer.

The above-mentioned damage to the capping layer and/or spacer may cause the thickness of the capping layer and/or the spacer that protect lines to decrease (e.g. a shoulder margin deficiency phenomena occurs), thereby resulting in an electrical short occurring between a first line (e.g., a gate line) that should be protected by the capping layer and the spacer, and a second line (e.g., a bit line) that is electrically connected to the SAC pad.

Accordingly, to prevent electrical shorts and a local height difference, a method of stably and accurately detecting the CMP end point should be utilized during node separation in the SAC pad process using a CMP process.

Thus, there is a need for a method of fabricating a self-aligned contact (SAC) pad of a semiconductor device, which obtains an improved process margin for a photolithography process that is used to form an opening hole for a SAC pad, and which may stably detect a chemical mechanical polishing (CMP) end point.

SUMMARY OF THE INVENTION

The present invention provides a method of fabricating a self-aligned contact (SAC) pad of a semiconductor device, thereby obtaining improved process margin for a photolithography process that is used to form an opening hole for a SAC pad, and stably detecting a chemical mechanical polishing (CMP) end point.

According to an exemplary embodiment of the present invention, a method of fabricating a SAC (self-aligned contact) pad is provided. The method includes forming stacks of a conductive line and a capping layer on a semiconductor substrate, spacers covering sidewalls of the stacks, and an insulation layer filling gaps between the stacks and exposing the top of the capping layer, etching the capping layer to form damascene grooves, forming a plurality of first etching masks with a material different from that of the capping layer to fill the damascene grooves without covering the top of the insulation layer, and forming a second etching mask having an opening region that exposes some of the first etching masks and a portion of the insulation layer located between the first etching masks. The method further includes etching the portion of the insulation layer exposed by the opening region using the first and second etching masks to form a plurality of opening holes, removing the second etching mask, forming a conductive layer filling the opening holes to cover the remaining first etching masks and performing a chemical mechanical polishing (CMP) process on the conductive layer using the capping layer as a polishing end point to remove the first etching masks such that a plurality of SAC pads separated from each other are formed that fill the opening holes.

According to an exemplary of the present invention, a method of fabricating a SAC (self-aligned contact) pad is provided. The method includes forming a layer for a gate line on a semiconductor substrate together with a gate dielectric layer, forming a capping layer on the layer for the gate line, etching the capping layer and the layer for the gate line to form stacks of the gate line and the capping layer, forming spacers to cover sidewalls of the stacks, forming an insulation layer filling gaps between the stacks, performing a CMP process on the insulation layer using the capping layer as a polishing end point, partially etching the exposed capping layer to form damascene grooves, forming a layer for a plurality of first etching masks filling the damascene grooves, and the layer is formed of a material different from that of the capping layer. The method further includes performing a CMP process on the layer for the first etching masks to expose the top of the insulation layer such that the first etching masks filling the damascene grooves are formed, forming a second etching mask having an opening region that exposes some of the first etching masks and a portion of the insulation layer located between the first etching masks, etching the insulation layer exposed by the opening region using the first and second etching masks to form a plurality of opening holes, removing the second etching mask, forming a conductive layer filling the opening holes to cover the remaining first etching masks and performing a chemical mechanical polishing (CMP) process on the conductive layer using the capping layer as a polishing end point to remove the first etching masks such that a plurality of SAC pads separated from each other are formed that fill the opening holes.

The method further may include: forming a layer for a gate line on the semiconductor substrate together with a gate dielectric layer before the forming of the layer for the gate line, forming a gate capping layer on the layer for the gate line, selectively etching the gate capping layer and the layer for the gate line to form gate stacks of the gate line and the gate capping layer, forming a gate spacer to cover sidewalls of the gate stacks, forming a first insulation layer to fill gaps between the gate stacks, performing a CMP process on the first insulation layer using the gate capping layer as a polishing end point, partially etching the exposed gate capping layer to form second damascene grooves, forming a layer for a plurality of third etching masks filling the second damascene grooves, the layer formed of a material different from that of the gate capping layer, forming the third etching masks filling the second damascene grooves by performing a CMP process on the layer for the third etching masks to expose the top of the first insulation layer, forming a fourth etching mask having an opening region that is disposed over the third etching masks and the exposed first insulation layer, forming a plurality of second opening holes in the opening region by using the fourth etching mask and the third etching masks to prevent a portion therebelow from being etched and selectively etching the first insulation layer that is exposed to the opening region, removing the fourth etching mask, forming the second conductive layer filling the second opening holes to cover the remaining third etching masks, using the gate capping layer as a polishing end point to perform a CMP process on the second conductive layer and to remove the remaining third etching masks during the CMP process such that a plurality of second SAC pads separated from each other are formed filling the second opening holes and forming a second insulation layer covering the second SAC pads below the insulation layer. The second opening holes penetrate the second insulation layer and expose the top of the second SAC pads.

The capping layer may include an insulation material having an etching selectivity with respect to the insulation layer.

The capping layer may be formed to include a silicon nitride.

The spacer may be formed to include an insulation material identical to that of the capping layer.

The forming of the damascene groove may include selectively wet-etching or dry-etching the capping layer with respect to the insulation layer.

The selective etching of the capping layer may include etching the top of the spacer to expand the width of the damascene grooves.

The method further may include additionally etching sidewalls of the insulation layer that are exposed to the opening region to expand the damascene grooves after the etching of the capping layer.

The first etching mask may be formed to include a layer having an etching selectivity with respect to the insulation layer.

The first etching masks may be formed to include a layer having a CMP selectivity with respect to the capping layer.

The first etching mask may be formed to comprise a layer having a CMP rate identical or greater than that of the conductive layer.

The first etching mask may be formed to include a polysilicon layer.

The first etching masks may be formed of one selected from the group consisting of a tungsten layer, an aluminum layer, and a ruthenium layer.

The first etching mask may be formed to include a material identical to that of the conductive layer.

The forming of the first etching mask may include: forming a mask layer filling the damascene groove and extending toward the insulation layer and performing a CMP process on the mask layer to expose the top of the insulation layer.

The second etching mask may be formed into a photoresist pattern including the opening region having a width sufficient to cover at least two conductive lines and the insulation layer therebetween.

According to exemplary embodiments of the present invention, an improved process margin for a photolithography process can be obtained more when forming an opening hole for the SAC pad. Moreover, with exemplary embodiments of the present invention, a polishing end point can be more accurately detected during a CMP process for SAC pad node separation.

BRIEF DESCRIPTION OF THE DRAWINGS

Exemplary embodiments of the present invention can be understood in more detail from the following description taken in conjunction with the accompanying drawings, in which.

DETAILED DESCRIPTION OF THE EXEMPLARY EMBODIMENTS

The present invention will now be described more fully with reference to the accompanying drawings, in which exemplary embodiments of the invention are shown. The invention may, however, be embodied in many different forms and should not be construed as being limited to the exemplary embodiments set forth herein.

When forming a self-aligned contact (SAC) pad, a chemical mechanical polishing (CMP) process is performed for node separation. According to an exemplary embodiment of the present invention, a capping layer is used as a polishing completion layer to detect a CMP end point.

At this point, to make the capping layer in identical thicknesses and/or identical top surface heights, an additional etching mask is used to prevent the capping layer from being etched when etching an opening hole for the SAC pad. The etching mask is formed on the capping layer and/or below the line in an aligned pattern such that the opening hole is self-aligned on the line.

On the other hand, the etching mask may be formed of material that can be polished at the same time when polishing a conductive layer for the SAC pad during a CMP process, which is used in a node separation process of the SAC pad. Accordingly, the capping layer below the etching mask may be formed of a polishing completion layer that is used to detect a polishing end point during a CMP process.

In exemplary embodiments of the present invention, when forming the opening hole for the SAC pad, an etching mask and the SAC CMP completion layer are formed of respectively different thin layers such that an independent CMP process can be performed on each SAC CMP process.

The capping layer used as a polishing completion layer during a CMP process is not damaged during an etching process before the CMP process, and thus the thickness and/or surface height of the capping layer are/is unchanged. Therefore, a CMP process can be accurately performed on the capping layer. For example, because of signal differences between respectively different thin layers such as the capping layer and the conductive layer (or, an etching mask), the polishing end point detection can be possible by detecting a material that constitutes the capping layer during the CMP process. Moreover, measuring the thickness of the capping layer after the CMP process can predict an amount of polishing and the thickness of the capping layer in a chip such that monitoring is possible after a SAC CMP process.

As the etching mask is removed together with the conductive layer during the CMP process, a local height difference on the resulting structure after the CMP process can be prevented. Accordingly, the surface of the resulting structure after forming the SAC pad is more planarized due to the CMP process such that a sufficient process margin for the photolithography process is obtained.

FIGS. 1 through 10 are perspective views illustrating a method of fabricating a SAC pad according to a first exemplary embodiment of the present invention.

Figure 1:
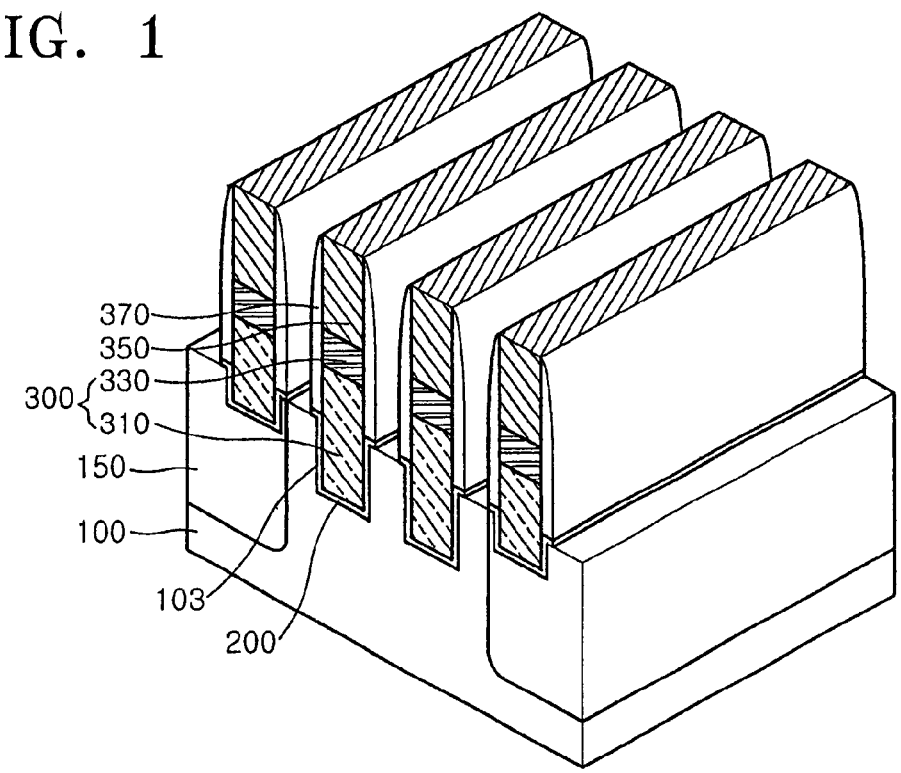
FIGS. 1 through 10 are perspective views illustrating a method of fabricating a SAC pad according to a first exemplary embodiment of the present invention.

Referring to FIG. 1, a plurality of gate lines 300 are formed on a semiconductor substrate 100. More specifically, a device isolation region 150 defining an active region is formed on the semiconductor substrate 100. The device isolation region 150 can be formed, for example, using a shallow trench isolation (STI) method.

Next, a gate dielectric layer 200 including a silicon oxide layer is formed on the semiconductor substrate 100, and then a conductive layer for the gate lines 300 is formed on the gate dielectric layer 200. To improve the conductivity of the gate dielectric layer 200, the conductive layer can be a multiple-layer structure of a first conductive layer 310 of a conductive poly-silicon material, and a second conductive layer 330 of a metal silicide.

Moreover, before forming the first and second conductive layers 310 and 330 for the gate lines 300, a recess trench 103 for a recess channel structure can be formed in the active region of the semiconductor substrate 100 to obtain the channel length of a transistor. In the recess channel structure, the gate dielectric layer 200 is formed in the recess trench 103, and the first and second conductive layers 310 and 330 for the gate lines 300 can be formed to fill the recess trench 103.

An insulation layer for a capping layer 350 is formed on the first and second conductive layers 310 and 330 to cover and protect the top portion of the gate lines 300. The thickness of the capping layer 350 varies according to the thickness of the gate line 300, or can be predetermined by considering the role of a CMP polishing completion layer in the following SAC pad process. For example, the thickness of the capping layer 350 can be about 1500 to about 2000 angstroms (Å).

The capping layer 350 can be formed of various insulation materials to protect and insulate the gate lines 300. The capping layer 350 can be used as a polishing completion layer in the CMP process that separates nodes of SAC pads and may be formed of an insulation material having a polishing selectivity to a conductive material constituting the SAC pads. That is, the capping layer 350 may be formed of an insulation material that has a sufficiently lower polishing rate than the conductive material of the SAC pad to be used as a polishing completion layer. Moreover, the capping layer 350 may be formed of an insulation material having an etching selectivity to an insulation layer filling gap between the gate lines 300. The insulation material can be, for example, a silicon nitride.

After depositing the first and second conductive layers 310 and 330 and the capping layer 350, the gate lines 300 and the capping layer 350 aligned on the gate lines 300 are patterned using a selective etching process.

Next, spacers 370 are formed to cover and protect sidewalls of the gate lines 300 and the capping layer 350 using a spacer process. The spacers 370 protect the gate lines 300 from being etched during an etching process that forms an opening hole in the following SAC pad formation process. Accordingly, the spacers 370 can be formed of an insulation material (e.g., silicon nitride) having an etching selectivity to an insulation layer (e.g., a silicon oxide layer) in which the opening hole is formed.

Figure 2:
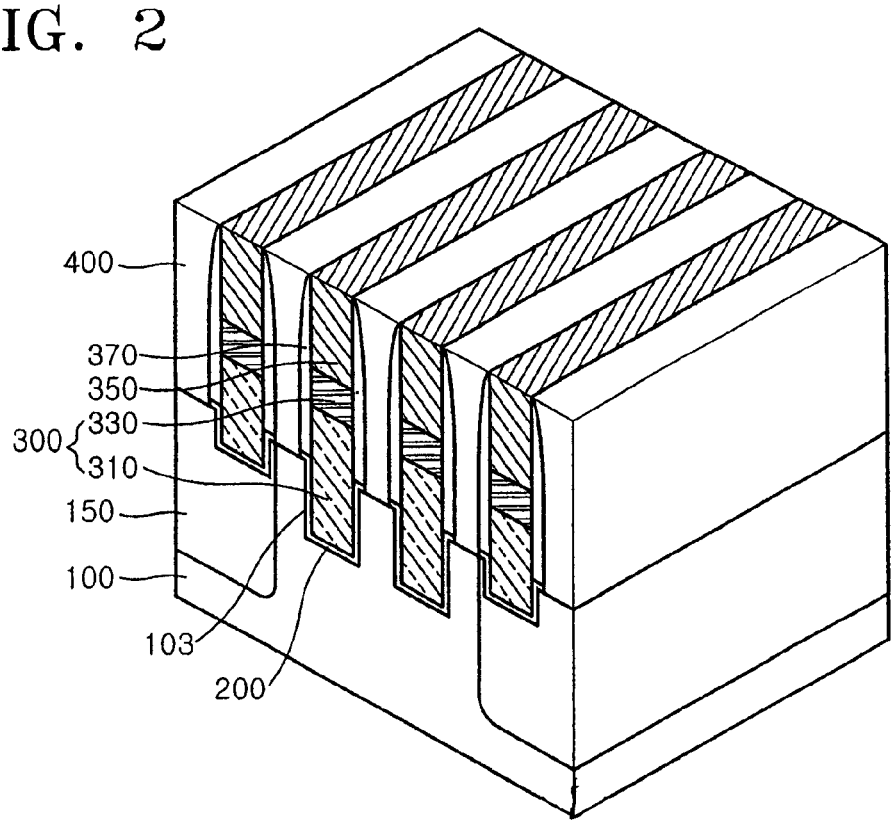

Referring to FIG. 2, an insulation layer 400 is formed to fill the gap between the gate lines 300. More specifically, the insulation layer 400 (e.g., a silicon oxide layer) is deposited on the capping layer 350 to fill the gap between the gate lines 300. Then, the insulation layer 400 may be planarized using a first CMP process. The first CMP process is performed using the capping layer 350 as a polishing completion layer. Accordingly, the top surface of the capping layer 350 can be exposed when polishing the surface of the insulation layer 400.

Figure 3:
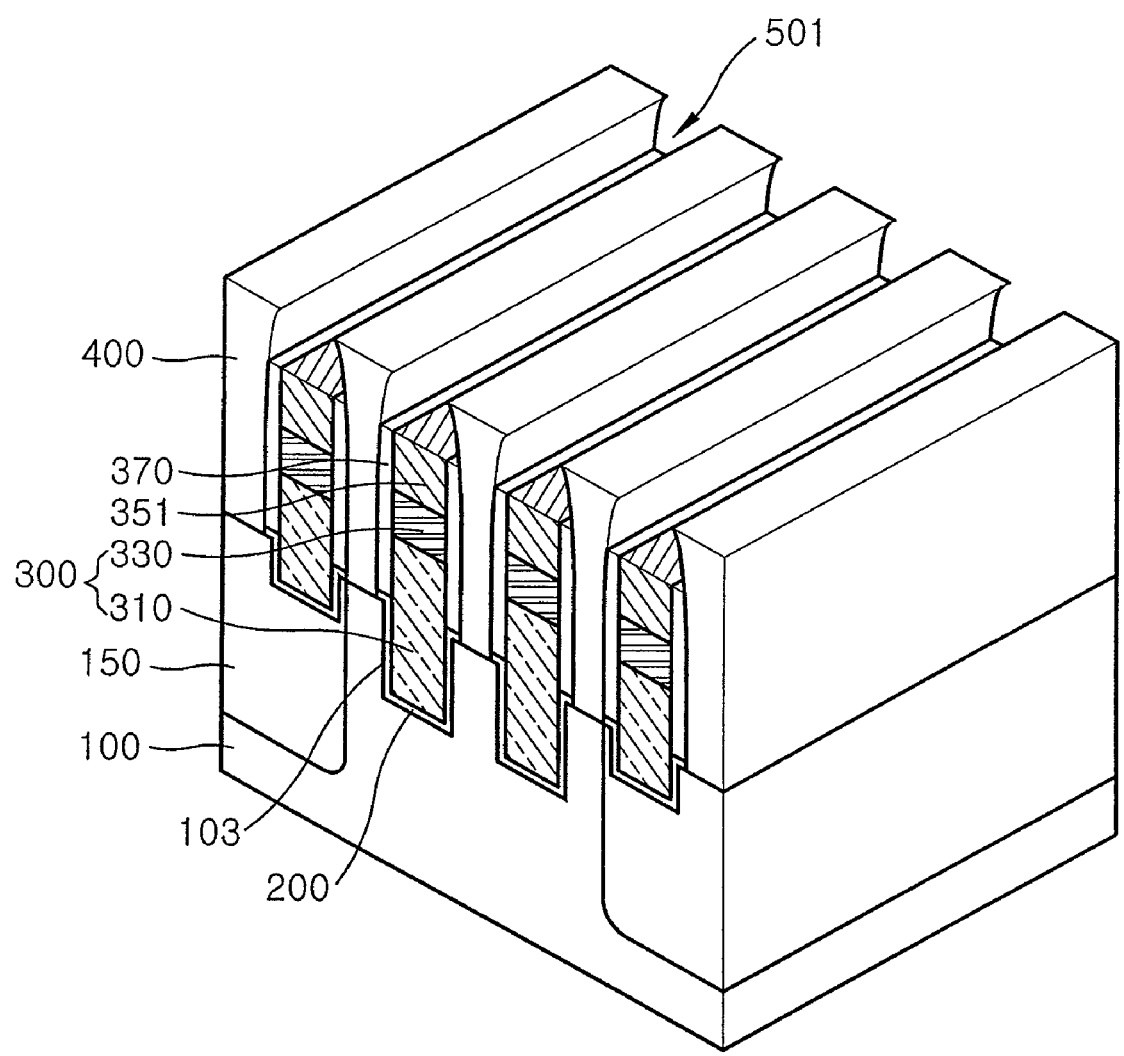

Referring to FIG. 3, using the etching selectivity between the insulation layer 400 and the capping layer 350, a selective etching process is performed on the surface of the capping layer 350 that is exposed by the first CMP process. This selective etching process is performed to selectively remove the top portion of the capping layer 350. This etching process has a relatively excellent etching rate for the silicon nitride of the capping layer 350, and a relatively low etching rate for the silicon oxide of the insulation layer 400. The etching process can be a wet etching process or a dry etching process.

Damascene grooves 501 having the insulation layer 400 as sidewalls and extending along the gate lines 300 are formed on the top of a capping layer 351 that is etched by selectively etching the capping layer 350. The depth of the damascene grooves 501 can be predetermined based upon the thickness of an etching mask that fills the damascene grooves 501 in the following process. The thickness of the etching mask depends on a thickness that is required in an etching process of forming an opening hole for the following SAC pad. Thus, the depth of the damascene grooves 501 (e.g., an etching amount of the capping layer 350) can be predetermined using the thickness of the etching mask.

On the other hand, during the selective etching of the capping layer 350, the spacers 370 formed of material desirably identical to that of the capping layer 350, and the top of the spacers 370 can be etched simultaneously. Additionally, after the selective etching of the capping layer 350, the width of the damascene grooves 501 is expanded by partially etching sidewalls of the insulation layer 400 constituting the damascene grooves 501. In these etching processes, the damascene grooves 501 can be expanded or an entrance shape of the damascene grooves 501 can be improved.

As the width of the damascene grooves 501 can be adjusted by the additional etching processes, the width of the etching mask formed to fill the damascene grooves 501 can be adjusted. When the width of the etching mask is greater than that of the capping layer 351 and/or the spacers 370, it is possible to effectively prevent the capping layer 351 and/or the spacers 370 from being damaged in the following etching process.

Figure 4:
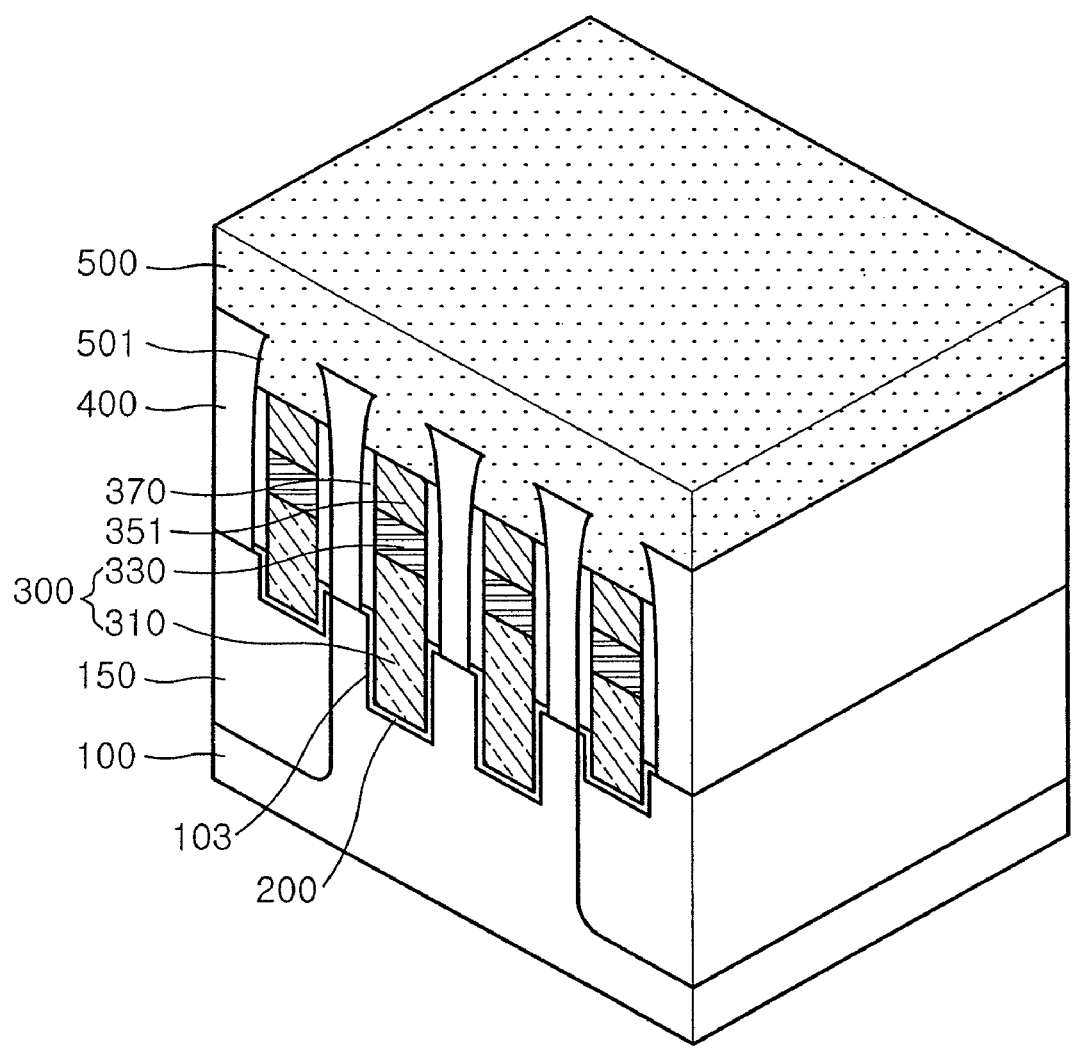

Referring to FIG. 4, an etching mask layer 500 of an insulation material that fills the damascene grooves 501 is foamed on the insulation layer 400. The etching mask layer 500 may be formed of material that can be polished together with the conductive layer for the SAC pad during a CMP process for the following SAC pad node separation. Moreover, the etching mask layer 500 can be formed of material having an etching selectivity to the insulation layer 400 so as to be used as an etching mask during an opening hole etching process for the SAC pad.

For example, the etching mask layer 500 can be formed of, for example, a polysilicon material having an etching selectivity identical or higher than that of silicon nitride having a relatively high etching selectivity to a silicon oxide constituting the insulating layer 400. Additionally, the etching mask layer 500 can be formed of, for example, a metal such as tungsten, aluminum, or ruthenium, which has a relatively high etching selectivity to silicon oxide. Moreover, the etching mask layer 500 can also comprise an anti-reflective coating (ARC) material.

Those etching mask layers 500 can have an etching selectivity to a silicon oxide and a CMP polishing rate equal to that of materials such as, for example, conductive polysilicon or tungsten. Accordingly, the etching mask layer 500 can be removed together with the conductive layer in a CMP process that is used for the SAC pad node separation.

Figure 5:
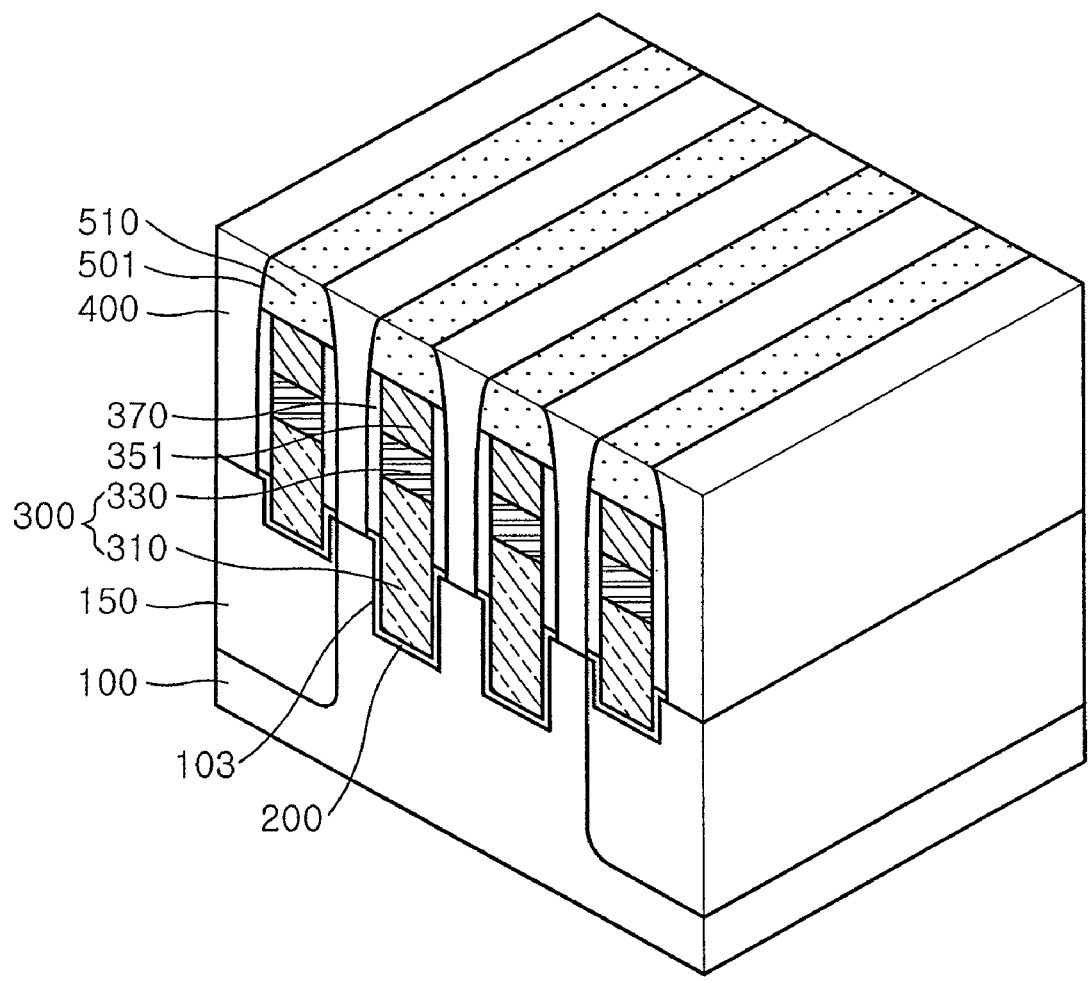

Referring to FIG. 5, an etching mask 510 is formed to fill the damascene grooves 501 and to cover the top of the etched capping layer 351 by performing a second CMP to planarize the etching mask layer 500. At this point, the second CMP process may be performed to expose the top of the insulation layer 400. The second CMP process can be performed using a polishing slurry that can embody a relatively higher polishing rate of a material constituting the etching mask layer 500 than a silicon oxide constituting the insulation layer 400. The etching mask 510 is patterned to cover the top of the spacers 370 adjacent to the capping layer 351 that is etched using those planarizing processes.

Figure 6:
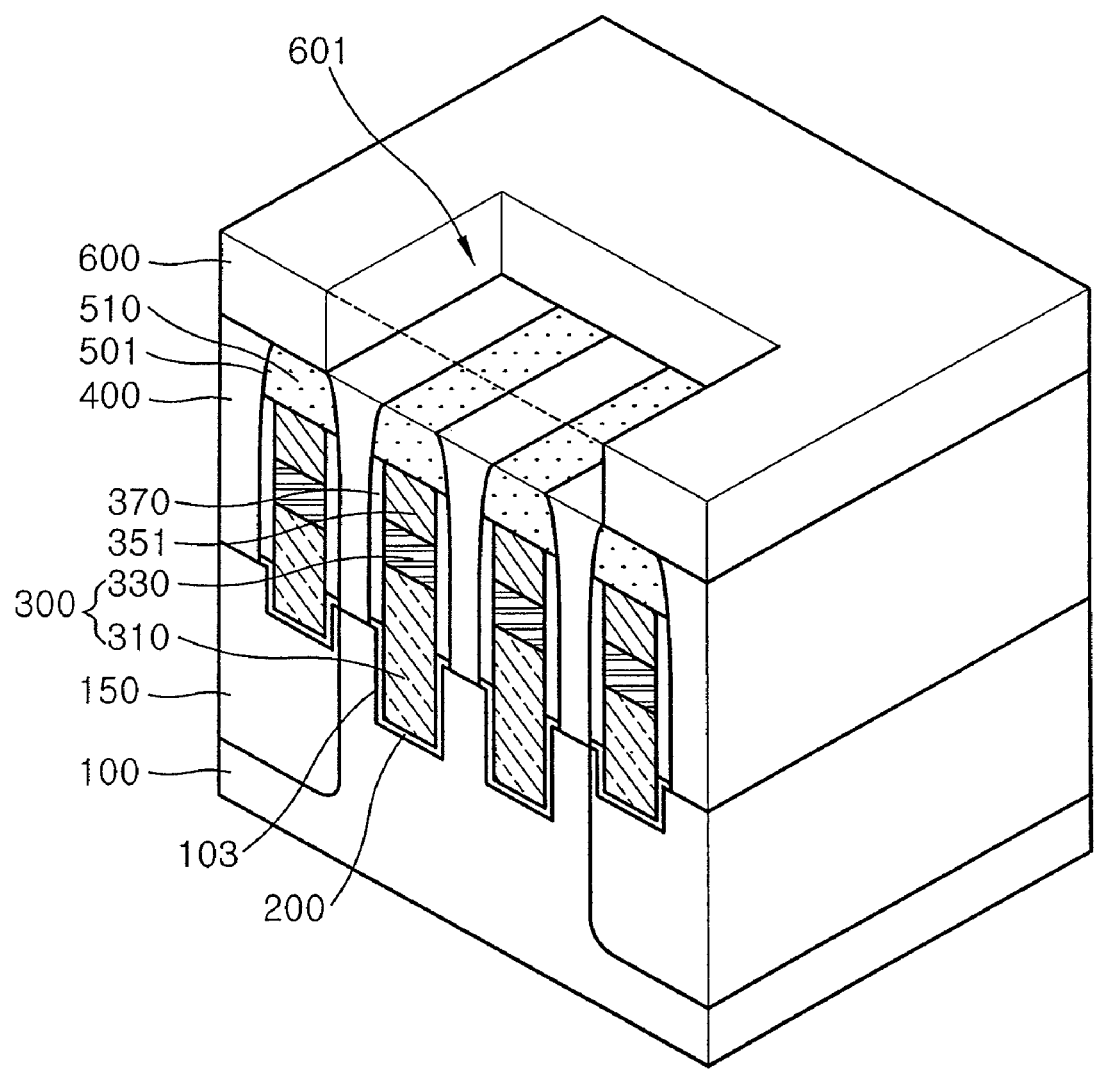

Referring to FIG. 6, a photoresist pattern is formed as a second etching mask to selectively etch a portion of the insulation layer 400 that is exposed between the etching mask 510. The photoresist pattern includes an opening region 601 that is used to selectively etch a portion of the insulation layer 400 filling the gap between the gate lines 300.

To obtain a photolithography process margin when forming the photoresist pattern, the opening region 601 is disposed on a plurality of gate lines 300. Accordingly, the opening region 601 is disposed on a plurality of etching masks 510 and an insulation layer between the etching masks 510.

As the opening region 601 is actually set to be broader than the gap between the gate lines 300, the photolithography process margin can be more easily obtained. An opening groove smaller than the limitation of the photolithography process can be formed for the SAC pad.

As the opening region 601 of the photoresist pattern is formed over the plurality of gate lines 300, the actual etching mask in the etching process that forms the opening hole for the SAC pad is a combination of a second etching mask of the photoresist pattern 600 and the first etching mask of the etching mask 510 exposed to the opening region 601.

Figure 7:
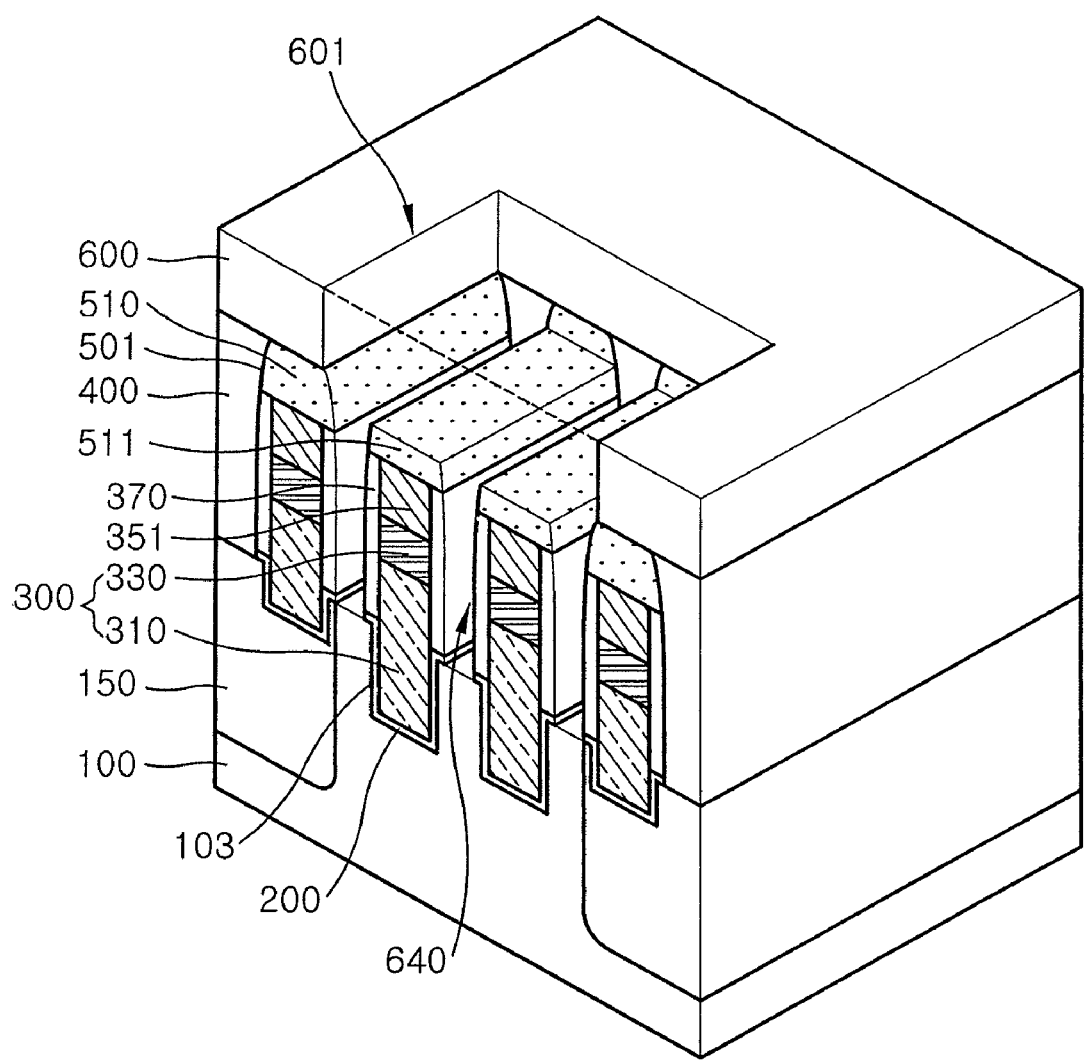

Referring to FIG. 7, the insulation layer 400 exposed by the first etching mask 510 and the second etching mask 600 is selectively etched to form a plurality opening holes 640 that exposes a portion of the semiconductor substrate 100 below the gap between the gate lines 300.

As the opening region 601 of the photoresist pattern in the second etching mask 600 exposes the insulation layer 400 between the plurality of first etching masks 510, the opening holes 640 are formed simultaneously between the gate lines 300. Accordingly, as the first etching mask 510 is aligned on the gate lines 300, the opening holes 640 are aligned on the gate lines 300. The spacers 370 of the gate lines 300 form sidewalls of the opening holes 640, and the insulation layer 400 forms the rest of sidewalls of the opening holes 640.

Figure 8:
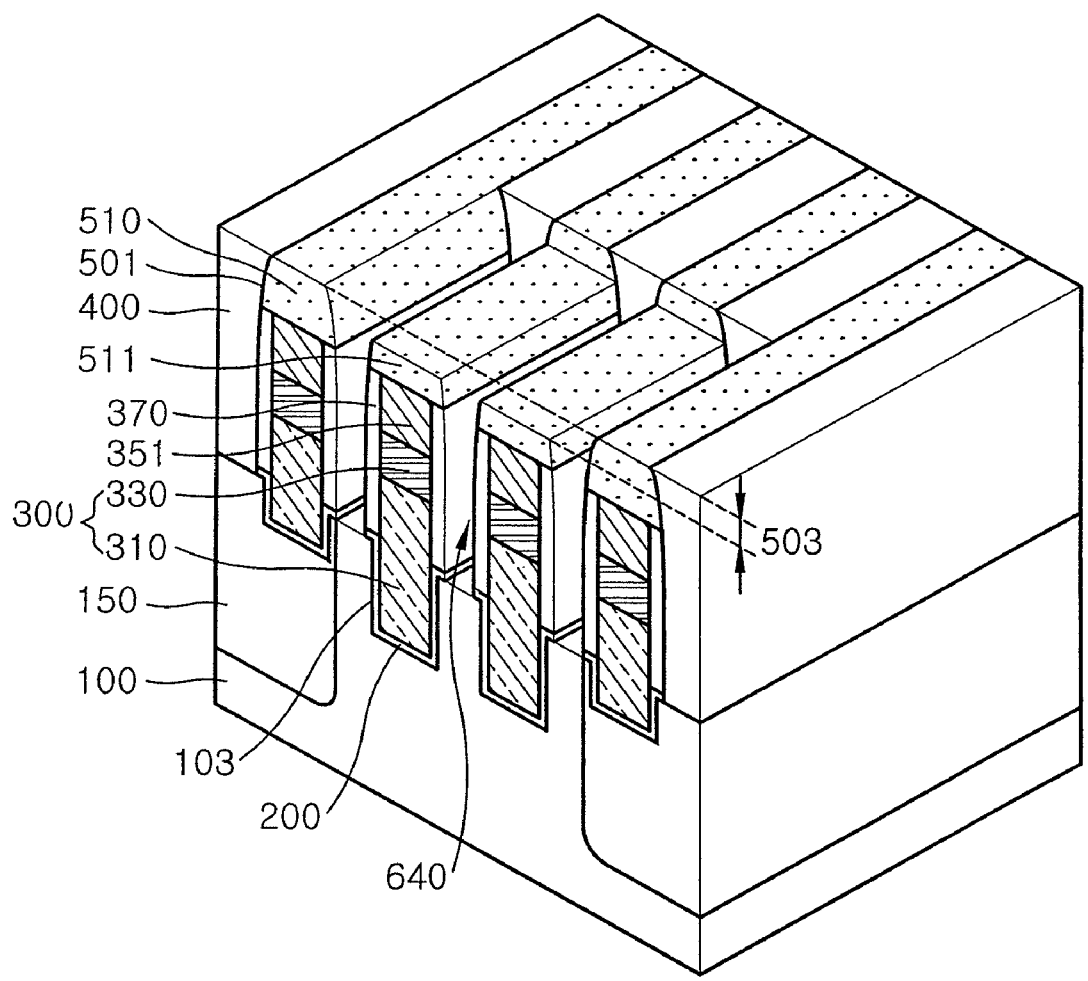

FIG. 8 is a view of when the second etching mask 600 of the photoresist pattern is removed. Some of the first etching masks 510 are exposed by the opening region 601 during the selective etching process (the exposed first etching mask will now be denoted by reference numeral 511). The exposed first etching masks 511 prevent the capping layer 351 from being etched. However, a portion of the thickness of the etching mask 511 can be reduced during an etching process. Accordingly, the thickness of the exposed first etching masks 511 can be smaller than the other first etching masks 510 covered by the second etching mask 600 of the photoresist pattern.

Figure 9:
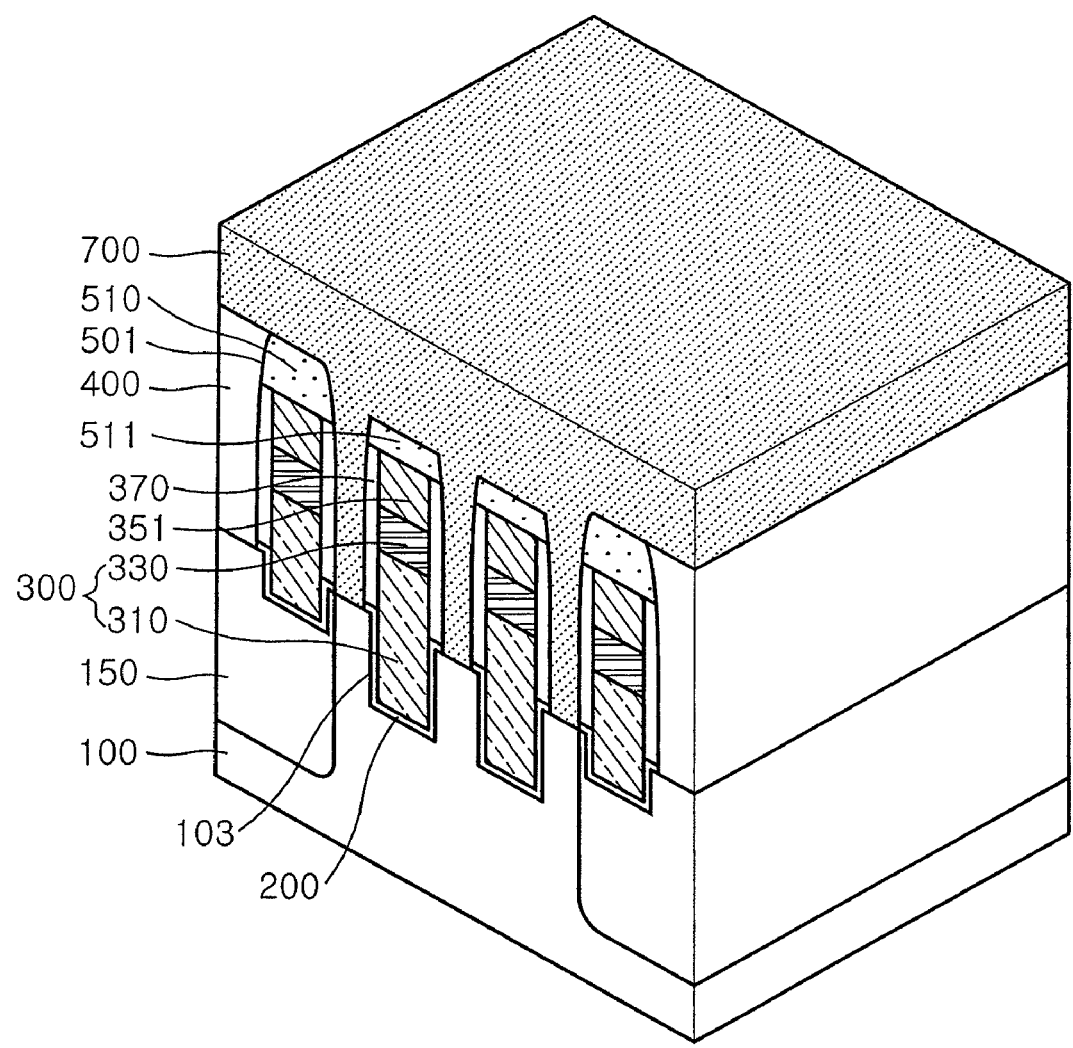

Referring to FIG. 9, a conductive layer 700 for the SAC contact pad filling the opening holes 640 is deposited to cover the first etching masks 510 including the exposed first etching mask 511 and the insulation layer 400 exposed by removing the second etching mask 600. The conductive layer 700 can be a conductive polysilicon layer. Additionally, the conductive layer 700 can include, for example, a metal such as tungsten.

Figure 10:
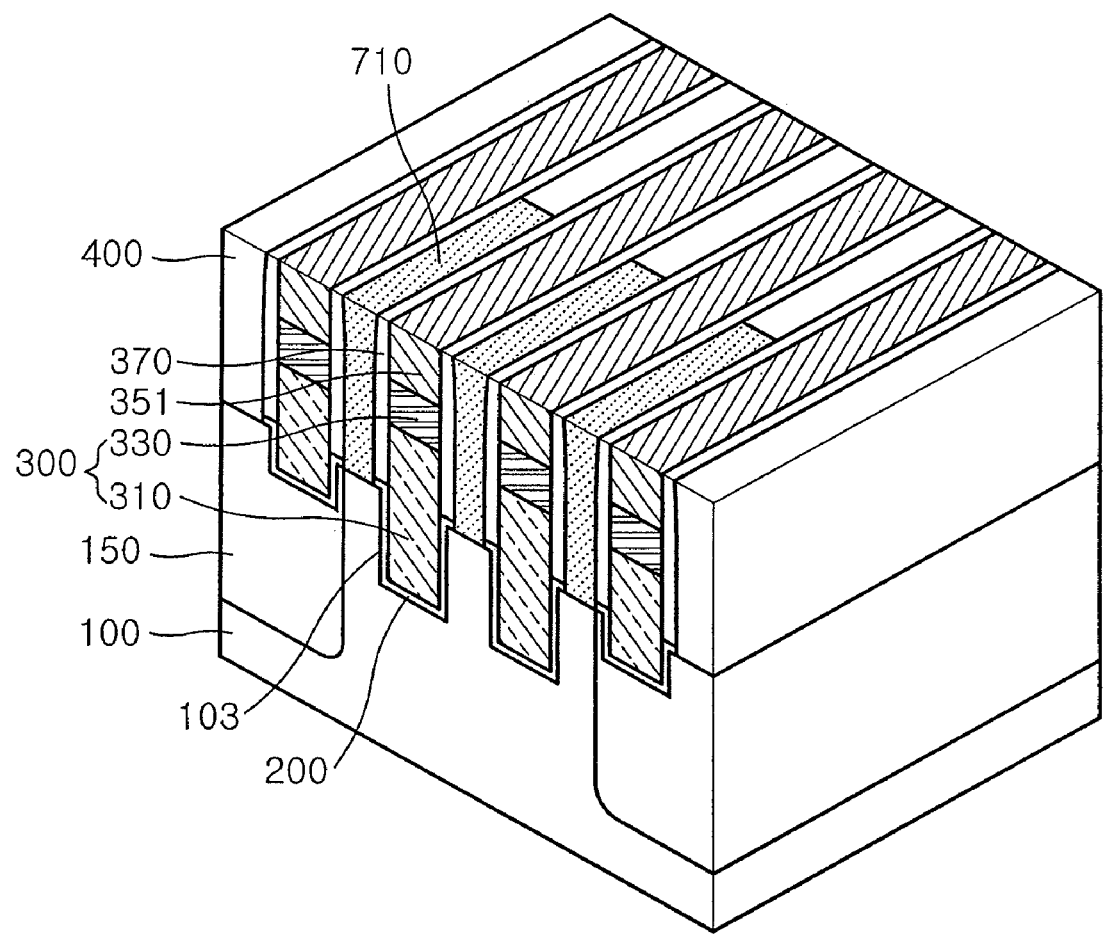

Referring to FIG. 10, the conductive layer 700 is polished and planarized using a planarization process such as a third CMP process. At this point, a polishing completion of the third CMP process is accomplished using the capping layer 351 as a polishing end point layer. The third CMP process is performed using a polishing slurry that can embody a relatively low etching rate in the capping layer 351 and a relatively high etching rate in the conductive layer 700.

The third CMP process is performed to remove the first etching masks 510, 511 below the conductive layer 700 together with the conductive layer 700. The first etching masks 510 and 511 are formed of material having an identical or relatively higher polishing rate than the conductive layer 700 for the SAC pad. Although the first etching mask 510, 511 have different thicknesses, the polishing may performed until the first etching masks 510 and 511 are completely removed as the capping layer 351 serves as the polishing completion layer to stop the CMP polishing process.

Accordingly, detecting a polishing end point can be accurately performed using a detect signal difference between various thin layers. For example, the point when a signal for a silicon nitride constituting the capping layer 351 is detected and the point when a signal for a polysilicon material constituting the first etching masks 510 and 511 is not detected can be used as a polishing end point.

During the third CMP process, a portion of the insulation layer 400 is removed together with the conductive layer 700, and the first etching masks 510 and 511. Accordingly, a plurality of SAC pads 710 may be formed on a plurality of positions at one time. The SAC pad 710 fills the opening hole 640 to be self-aligned on the gate line 300. At this time, as the polishing end point can be accurately detected, the third CMP process can be accurately performed on the capping layer 351. As the third CMP process is performed on the capping layer 351 below the first etching masks 510 and 511, the node separation of the SAC pad 710 can be performed more accurately. Therefore, the reliability for the node separation can increase.

Moreover, as the capping layer 351 is used as a polishing completion layer to stop performing an etching process, the capping layers 351 have the same surface height after the third CMP process. Thus, because of the third CMP, the surface heights of the capping layer 351, the SAC pad 710, and the remaining insulation layer actually become identical. Thus, the resulting structure after the third CMP process is planarized such that a local height difference can be prevented.

Moreover, as the third CMP process is performed to have an etching selectivity with respect to the capping layer 351, the loss of the capping layer 351 can be effectively prevented. Additionally, the loss of the spacers 370 that are formed of an insulation material identical to the capping layer 351 can be prevented. Accordingly, as the sufficient thicknesses of the capping layer 351 and/or the spacers 370 remain on the gate lines 300, electrical shorts between the gate lines 300 and bit lines on the gate lines 300 can be effectively prevented.

On the other hand, as the third CMP process terminates on the capping layer 351, it is possible to predict the polishing amount of the third CMP process by only measuring the thickness of the remaining capping layer 351 after the third CMP process. Additionally, during the third CMP process, it is possible to predict the remaining thickness of the capping layer 351. That is, it is possible to monitor a CMP characteristic after performing the third CMP process for the SAC pad 710.

The effectiveness according to the first exemplary embodiment of the present invention can be clearly illustrated when compared to the SAC formation process without using the first etching mask 510.

Figure 11:
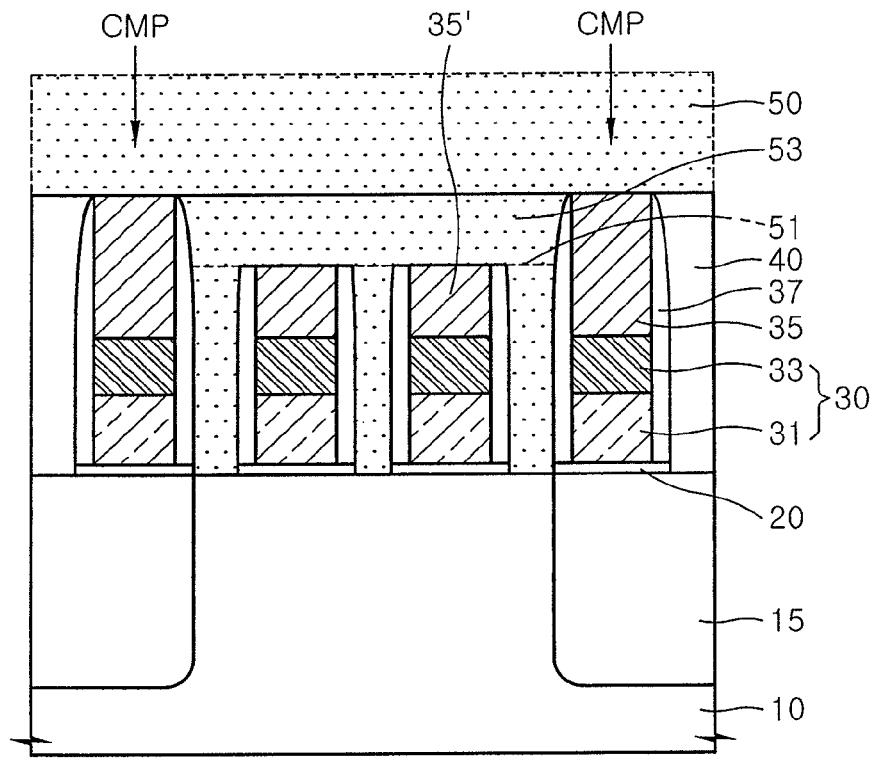
FIG. 11 is a sectional view of a comparative example illustrating an effectiveness of a method of fabricating a SAC pad according to an exemplary embodiment of the present invention.
Figure 12:
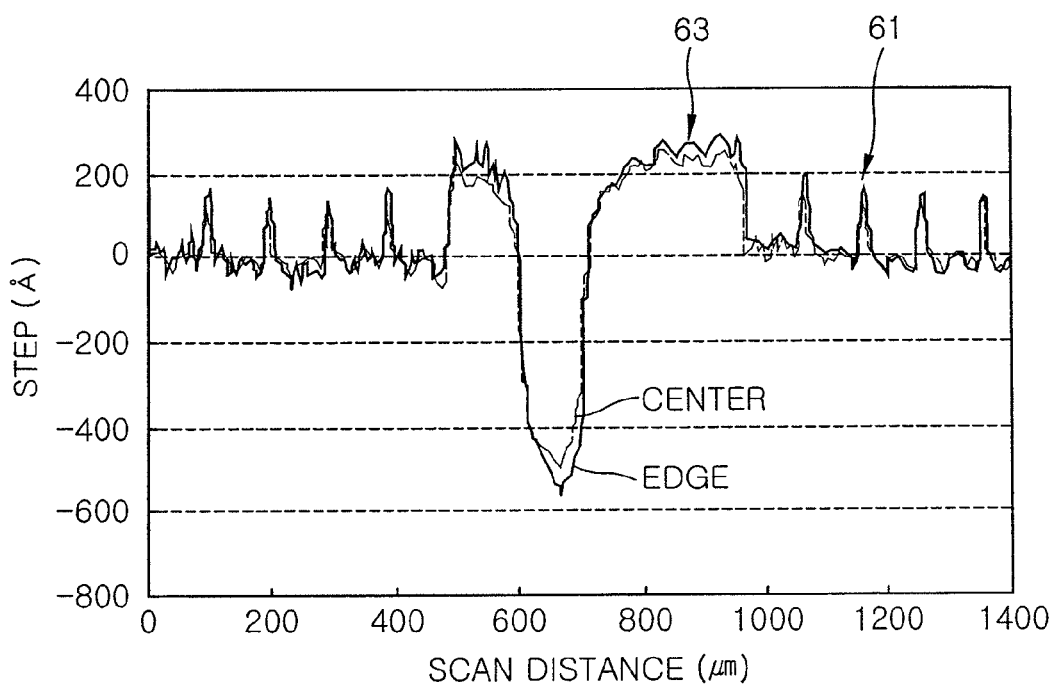
FIG. 12 is a graph illustrating a local height difference generated from the comparative example of FIG. 11 after a CMP process.

FIG. 11 is a sectional view of a comparative example illustrating an effectiveness of a method of fabricating a SAC pad according to an exemplary embodiment of the present invention. FIG. 12 is a graph illustrating a local height difference generated from the comparative example of FIG. 11 after a CMP process.

Referring to FIG. 11, unlike the first exemplary embodiment of FIGS. 1 through 10, a capping layer 35 is used as a polishing end point in the CMP process for the SAC pad 51 without a first etching mask 510.

More specifically, a method of fabricating the SAC pad 51 according to a comparative example includes forming a device isolation region 15 on a semiconductor substrate 10, and forming a plurality of gate lines 30 having first and second conductive layers 31 and 33 on a gate dielectric layer 20, and stacks of the capping layer 35.

After forming spacers 37 on sidewalls of the stacks and an insulation layer 40 filling the gaps between the gate lines 30, as illustrated in FIG. 1, an opening hole can be formed by using the photoresist pattern having the opening region 601 of FIG. 6 as a second etching mask 600. At this point, unlike the first exemplary embodiment, the opening hole is formed in the gap between the gate lines 30 by using the capping layer 35 as another first etching mask. However, when forming the opening hole during an etching process, a portion of the capping layer 35' that is used as the first etching mask is removed.

Accordingly, as illustrated in FIG. 11, there is a height difference between the portion of the capping layer 35' that is used as the first etching mask and the portion of the capping layer 35' that is not used as the first etching mask. In this situation, when the conductive layer 50 filling the opening hole is formed and then the node separation of the SAC pad 51 is performed using a CMP process, the CMP process is performed until the top surface of the capping layer 35' having a relatively low height is exposed.

However, if the capping layer 35' is used as a CMP end point, the CMP process terminates when the CMP end point is detected on the capping layer 35' without primary thickness loss. The polished conductive layer 53 remains on the portion of the capping layer 35' having a reduced thickness such that the node separation is not performed. Accordingly, other CMP processes need to be performed for the node separation.

The degree of the reduced thickness of the capping layer 35' depends on an etching process that is performed to form the opening hole such that it is difficult to determine a polishing amount that will be used in the other CMP. If controlling the other CMP processes to embody a large amount of CMP, a thickness of the capping layer 35' is additionally removed such that the remaining thickness becomes very small. In this case, because of the reduced thickness of the remaining capping layer 35', an electrical short can occur between conductive layers such as the gate lines 30 and bit lines. That is, a shoulder margin reduces substantially.

On the other hand, it is difficult to detect an end point during the SAC CMP, and there is actually no method to monitor the result after the SAC CMP process. That is, it is difficult to find a measuring object that can predict a CMP amount from the resulting structure after the CMP process.

On the other hand, the height difference between the capping layer 35 that is un-etched and the capping layer 35' that is etched can cause a local height difference on the resulting structure after the CMP process. After the CMP process to form the SAC pad, a measurement result according to a comparative example is illustrated in FIG. 12. FIG. 12 is a graph illustrating a local height difference generated from the comparative example of FIG. 11 after a chemical mechanical polishing (CMP) process.

Referring to FIG. 12, the height difference of the surface that is scanned from the center of a wafer is actually identical to that of the surface that is scanned from the edge of the wafer. There is a height difference of about 200 Å or higher between a region 61 having the SAC pad 51, and a region 63 without the SAC pad 51 and where the gate line 30 is extended. The local height difference is caused by the local difference of the CMP amounts according to the reduced thickness of the capping layer 35'.

Compared to the result of the comparative example, a method of fabricating the SAC pad according to a first exemplary embodiment of the present invention can exclude the other CMP process. Accordingly, the damage to the capping layer 35' due to the other CMP can be prevented. Moreover, problems caused by a time change according to other CMP processes can be resolved and the node separation of the SAC pad can be embodied more reliably. The local height difference after the CMP process can be prevented and also it is possible to monitor and predict the CMP amount after the SAC CMP process. During the SAC CMP process, a polishing end point can be accurately detected.

Although a process of forming the SAC pad 710 in the gap between the gate lines 300 is described in the first exemplary embodiment of the present invention, the present invention can also be applied to form the SAC pad as a storage contact pad that is electrically connected to a storage electrode of a capacitor that is disposed in gaps between bit lines to be self-aligned on the bit lines.

FIGS. 13 through 18 are sectional views illustrating a method of fabricating a SAC pad according to a second exemplary embodiment of the present invention. Like reference numerals denote like elements in the first and second embodiments.

Figure 13:
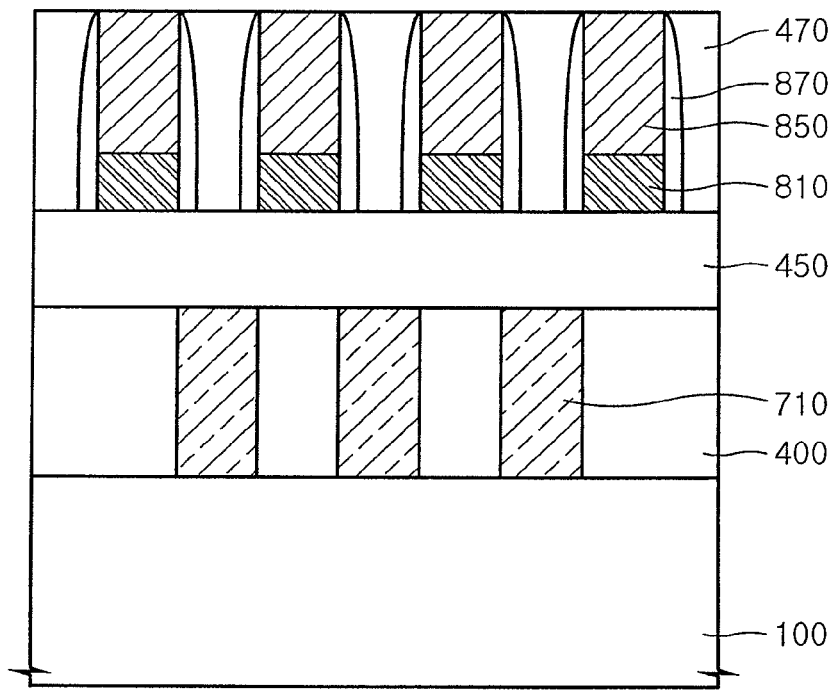
FIGS. 13 through 18 are sectional views illustrating a method of fabricating a SAC pad according to a second exemplary embodiment of the present invention.

Referring to FIG. 13, as illustrated in FIGS. 1 through 10, a plurality of first SAC pads 710 are formed on a semiconductor substrate 100, and then a second insulation layer 450 covering and insulating the first SAC pads 710 is formed on a first insulation layer 400. The second insulation layer 450 can be formed to include a silicon oxide layer.

Next, bit lines 810 are formed on the second insulation layer 450, which is electrically connected to a portion of the first SAC pads 710 using a through hole. For this, the through hole that exposes a portion of the first SAC pads 710 and penetrates the second insulation layer 450 is formed before forming the bit line 810, and then a conductive layer (e.g., tungsten layer) for the bit line 810 is formed to fill the through hole.

Like the first capping layer 350 for the gate line, a second capping layer 850 is formed on the conductive layer for the bit line 810. The second capping layer 850 can have a different thickness according to the thickness of the bit line 810 like the first capping layer 350. Moreover, the thickness of the second capping layer 850 can be determined based upon the role of a CMP completion layer in a subsequent process for a second SAC pad.

Accordingly, the second capping layer 850 may be formed of an insulation layer having a polishing selectivity to conductive material of the second SAC pad based upon the role as a polishing completion layer in the CMP process for the node separation of the second SAC pad. Additionally, the second capping layer 850 may be formed of an insulation material having an etching selectivity to an insulation layer filing the gap between the bit lines 810. The insulation material can be, for example, a silicon nitride.

Next, the second capping layer 850 and the conductive layer are patterned using a selective etching process to form the second capping layer 850 on the bit lines 810. Like the first spacer 370 for the gate lines 300 in FIG. 1, second spacers 870 formed of a silicon nitride are formed on sidewalls of the bit lines 810.

A third insulating layer 470 filling the gap between the bit lines 810 is formed like the first insulation layer 400 of FIG. 2. The third insulation layer 470 is planarized using a fourth CMP process like the first CMP process.

Figure 14:
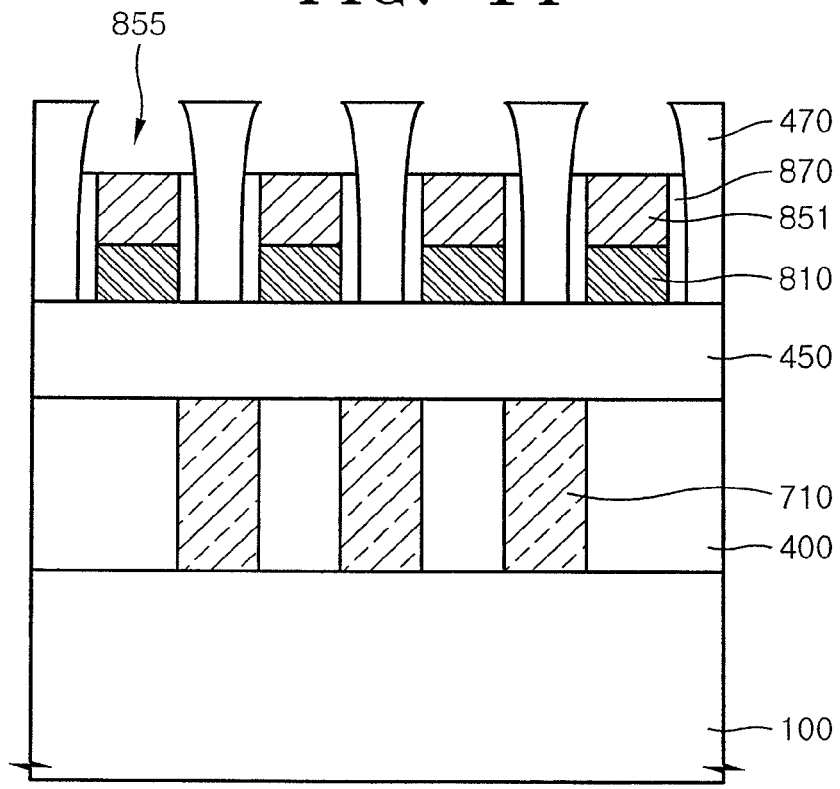

Referring to FIG. 14, a selective etching process is performed on the surface of the second capping layer 850 exposed by the fourth CMP process, as illustrated in FIG. 3, to form a plurality of damascene second grooves 855 exposing an etched surface of a second capping layer 851 and extending along the bit lines 810 using an etching selectivity between the third insulation layer 470 and the second capping layer 850. The forming of the damascene second grooves 855 can be similar to the formation of the damascene grooves 501 of FIG. 3.

Figure 15:
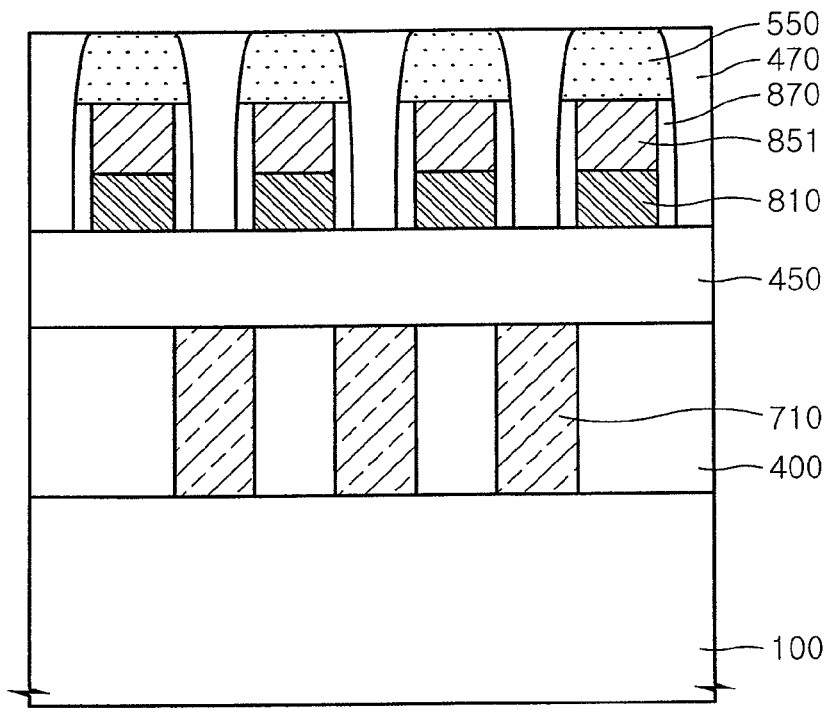

Referring to FIG. 15, third etching masks 550 composed of an insulation material filling the damascene second grooves 855 are formed using a process identical to that for forming the first etching mask 510.

Figure 16:
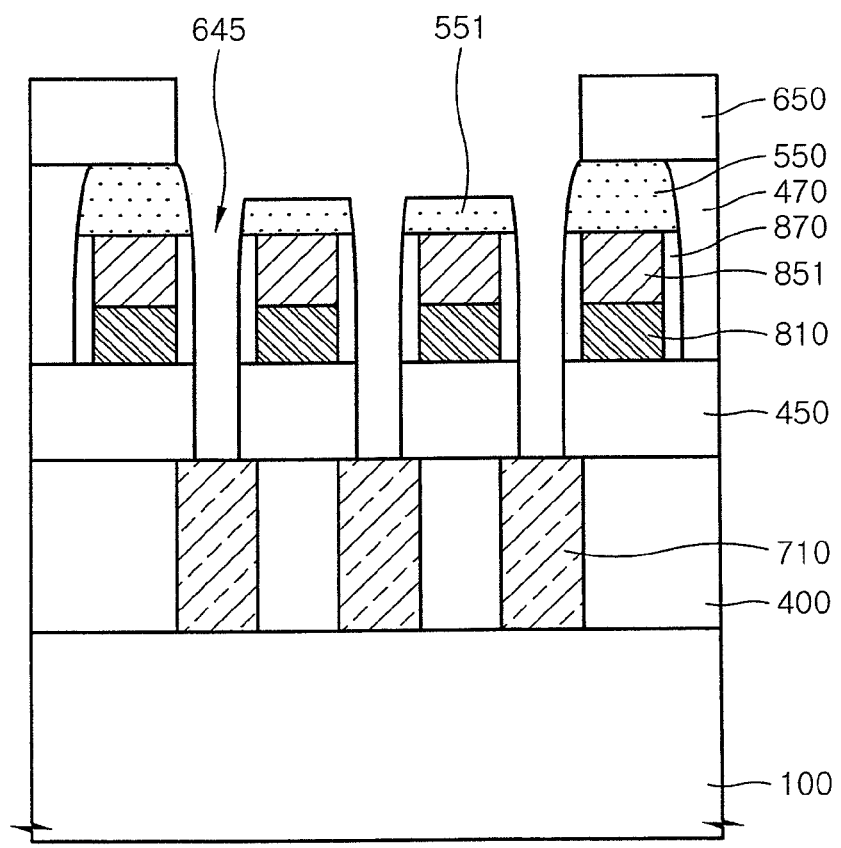

Referring to FIG. 16, a second photoresist pattern as a fourth etching mask 650, which has an opening region that exposes the third etching masks 550, are formed like the first photoresist pattern of FIG. 6 as the second etching mask.

Next, like FIG. 7, the third insulation layer 470 exposed by the third etching mask 550 and the fourth etching mask 650 is selectively etched, and then the second insulation layer 450 exposed in the resulting structure is selectively etched. Then, second opening holes 645 exposing the top surface of the SAC pads 710 that are aligned with the gap between the bit lines 810 are formed like the opening holes 640 of FIGS. 7 and 8.

At this point, like the first etching mask 511 of FIG. 8 having the reduced thickness, a third etching mask 551 of FIG. 16 having a reduced thickness is formed.

Figure 17:
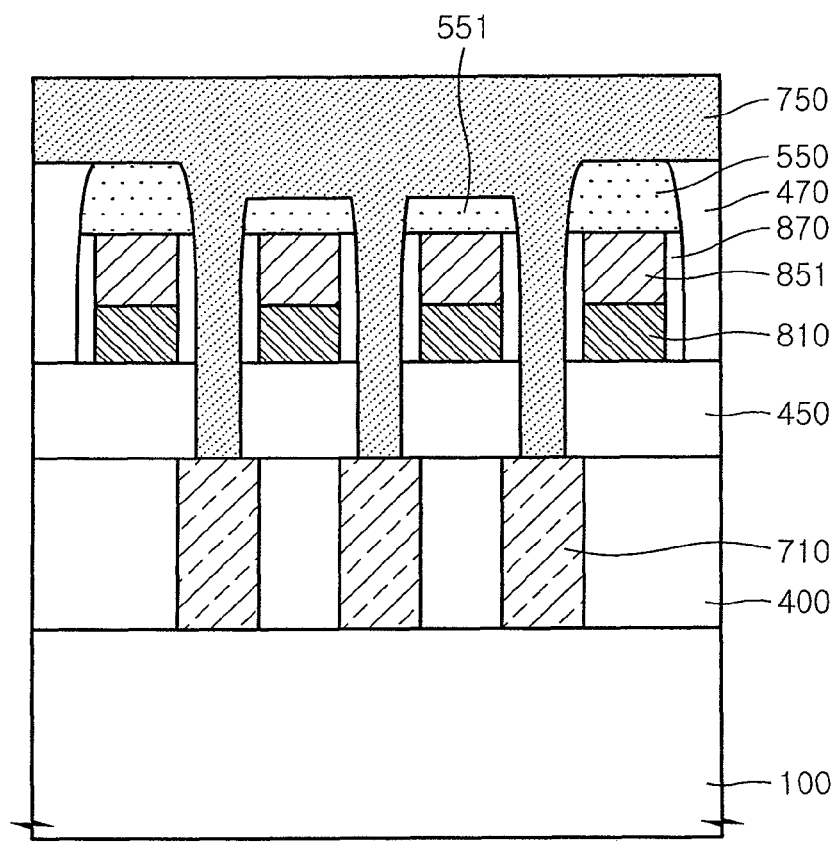

Referring to FIG. 17, a conductive layer 750 for the second SAC contact pad filling the second opening holes 645 of FIG. 16 is deposited to cover the remaining third etching masks 550 and 551 and the top of the third insulation layer 470.

Figure 18:
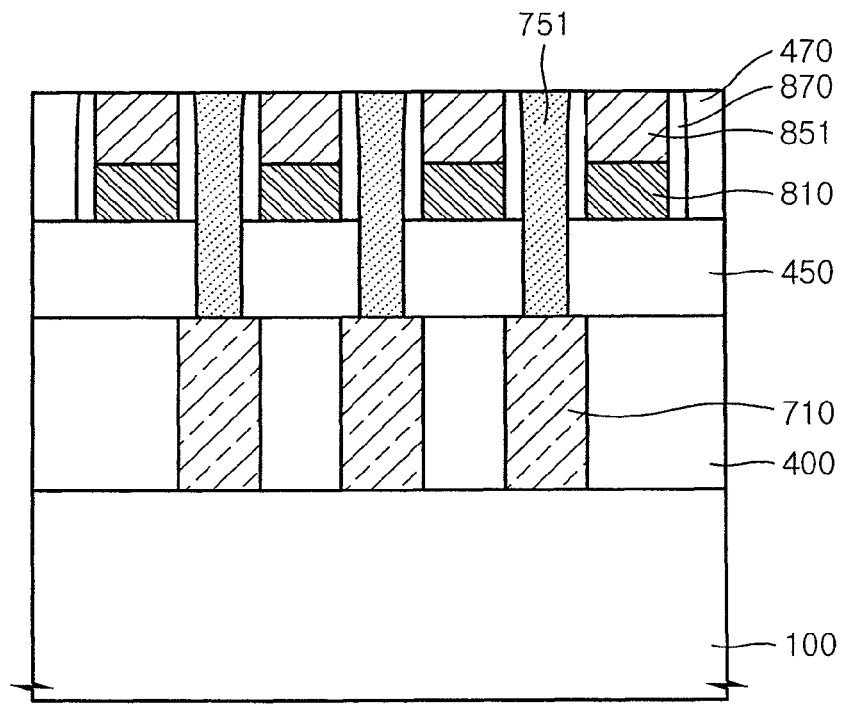

Referring to FIG. 18, a plurality of second SAC pads 751 separated from each other are formed using CMP like the third CMP process used to form the first SAC pads 710 of FIG. 10. The second SAC pads 751 are electrically connected to a storage electrode of the capacitor above the second SAC pads 751 and can be used as a storage contact connecting the storage electrode to the transistor on the semiconductor substrate 100.

In the second exemplary embodiment, the second SAC pads 751 that are self-aligned with the bit lines 810 can be formed using a manufacturing process identical to that used to form the first SAC pads 710 that are self-aligned with the gate lines 300 in the first exemplary embodiment. Therefore, the same effectiveness according to the first exemplary embodiment of the present invention can be achieved in the second exemplary embodiment of the present invention.

According to exemplary embodiments of the present invention, an etching mask is used on a capping layer using a damascene CMP process to prevent the capping layer from being damaged when etching an opening hole for a SAC pad. By using the capping layer as a polishing end point of the SAC CMP process, the polishing end point can be accurately detected during the SAC CMP process.

Accordingly, with exemplary embodiments of the present invention, the CMP process may be accurately controlled for obtaining reliable SAC pad node separation. A more reliable SAC pad node separation can thus be achieved. Moreover, a local height difference can be prevented after the CMP process, and it is also possible to predict the CMP amount by monitoring the CMP resulting structure after the SAC CMP process.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of fabricating a SAC (self-aligned contact) pad, comprising:
   forming a layer for a gate line on a semiconductor substrate together with a gate dielectric layer;
   forming a capping layer on the layer for the gate line;
   etching the capping layer and the layer for the gate line to form stacks of the gate line and the capping layer;
   forming spacers to cover sidewalls of the stacks;
   forming an insulation layer filling gaps between the stacks;
   performing a chemical mechanical polishing (CMP) process on the insulation layer using the capping layer as a polishing end point;
   partially etching the exposed capping layer to form damascene grooves on the remaining capping layer;
   forming a layer for a plurality of first etching masks filling the damascene grooves, the layer formed of a material different from that of the capping layer;
   performing a CMP process on the layer for the first etching masks to expose the top of the insulation layer such that the first etching masks filling the damascene grooves are formed;
   forming a second etching mask having an opening region that exposes some of the first etching masks and a portion of the insulation layer located between the first etching masks;
   etching the insulation layer exposed by the opening region using the first and second etching masks to form a plurality of opening holes;
   removing the second etching mask;
   forming a conductive layer filling the opening holes to cover the remaining first etching masks; and performing a chemical mechanical polishing (CMP) process on the conductive layer using the capping layer as a polishing end point to remove the first etching masks such that a plurality of SAC pads separated from each other are formed that fill the opening holes.

2. The method of claim 1, further comprising forming a recess trench to form a recess channel on the bottom of the semiconductor substrate by partially etching the semiconductor substrate to bury the gate line before the forming of the layer for the gate line.

3. The method of claim 1, wherein the capping layer is formed to comprise an insulation material having a CMP selectivity with respect to the first etching masks.

4. The method of claim 1, wherein the first etching masks are formed to comprise a layer having an etching selectivity with respect to the insulation layer.

5. The method of claim 1, wherein the first etching masks are formed to comprise a layer having a CMP selectivity with respect to the capping layer.

6. The method of claim 1, wherein the first etching mask is formed to comprise a material identical to that of the conductive layer.

7. The method of claim 1, wherein the second etching mask is formed as a photoresist pattern including the opening region having a width sufficient to cover at least two conductive lines and the insulation layer therebetween.

8. A method of fabricating a SAC (self-aligned contact) pad, comprising:
   forming a layer for a bit line on a semiconductor substrate;
   forming a capping layer on the layer for the bit line;
   etching the capping layer and the layer for the bit line to form stacks of the bit line and the capping layer;
   forming spacers to cover sidewalls of the stacks;
   forming an insulation layer filling gaps between the stacks;
   performing a chemical mechanical polishing (CMP) process on the insulation layer using the capping layer as a polishing end point;
   partially etching the exposed capping layer to form damascene grooves in the remaining capping layer;
   forming a layer for a plurality of first etching masks filling the damascene grooves, the layer formed of a material different from that of the capping layer;
   performing a CMP process on the layer for the first etching masks to expose the top of the insulation layer such that the first etching masks filling the damascene grooves are formed;
   forming a second etching mask having an opening region that exposes some of the first etching masks and a portion of the insulation layer located between the first etching masks;
   etching the insulation layer exposed by the opening region using the first and second etching masks to form a plurality of opening holes;
   removing the second etching mask;
   forming a conductive layer filling the opening holes to cover the remaining first etching masks; and
   performing a chemical mechanical polishing (CMP) process on the conductive layer using the capping layer as a polishing end point to remove the first etching masks such that a plurality of SAC pads separated from each other are formed that fill the opening holes.

9. The method of claim 8, before the forming of the layer for the bit line further comprising:
   forming a layer for a gate line on the semiconductor substrate with a gate dielectric layer;
   forming a gate capping layer on the layer for the gate line;
   etching the gate capping layer and the layer for the gate line to form gate stacks of the gate line and the gate capping layer;
   forming a gate spacer to cover sidewalls of the gate stacks;
   forming a first insulation layer to fill gaps between the gate stacks; performing a CMP process on the first insulation layer using the gate capping layer as a polishing end point;
   partially etching the exposed gate capping layer to form second damascene grooves;
   forming a layer for a plurality of third etching masks filling the second damascene grooves, the layer formed of a material different from that of the gate capping layer;
   forming the third etching masks filling the second damascene grooves by performing a CMP process on the layer for the third etching masks to expose the top of the first insulation layer;
   forming a fourth etching mask having an opening region that is disposed over the third etching masks and the exposed first insulation layer;
   forming a plurality of second opening holes in the opening region by using the fourth etching mask and the third etching masks to prevent a portion therebelow from being etched and selectively etching the first insulation layer that is exposed to the opening region;

removing the fourth etching mask;

forming the second conductive layer filling the second opening holes to cover the remaining third etching masks;

using the gate capping layer as a polishing end point to perform a CMP process on the second conductive layer and to remove the remaining third etching masks during the CMP process such that the second SAC pads filling the second opening holes are separated; and forming a second insulation layer covering the second SAC pads below the insulation layer, wherein the second opening holes penetrate the second insulation layer and expose the top of the second SAC pads.

* * * * *